United States Patent
Yamada (10) Patent No.: US 8,085,570 B2
(45) Date of Patent: Dec. 27, 2011

(54) MEMORY

(75) Inventor: Kouichi Yamada, Gifu (JP)

(73) Assignees: Sanyo Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 148 days.

(21) Appl. No.: 12/615,086

(22) Filed: Nov. 9, 2009

(65) Prior Publication Data

US 2010/0128506 A1    May 27, 2010

(30) Foreign Application Priority Data

Nov. 21, 2008  (JP) ................................. 2008-298632
Nov. 21, 2008  (JP) ................................. 2008-298645

(51) Int. Cl.
*G11C 17/00*   (2006.01)
*G11C 17/06*   (2006.01)
*G11C 7/00*    (2006.01)

(52) U.S. Cl. .......... 365/94; 365/103; 365/104; 365/105; 365/201

(58) Field of Classification Search ................... 365/94, 365/103, 104, 105, 201
See application file for complete search history.

(56) References Cited

U.S. PATENT DOCUMENTS

| 4,070,654 | A | * | 1/1978 | Tachi | 365/104 |
| 4,884,238 | A | * | 11/1989 | Lee et al. | 365/105 |
| 5,737,259 | A | * | 4/1998 | Chang | 365/105 |
| 5,847,988 | A | * | 12/1998 | Babson et al. | 365/105 |
| 5,905,670 | A | * | 5/1999 | Babson et al. | 365/105 |
| 7,518,900 | B2 | * | 4/2009 | Yamada | 365/105 |
| 7,746,690 | B2 | * | 6/2010 | Yamada | 365/105 |
| 2007/0242542 | A1 | | 10/2007 | Yamada | |

FOREIGN PATENT DOCUMENTS

JP   2007-200464   8/2007
JP   2007-294070   11/2007

* cited by examiner

*Primary Examiner* — Trong Phan
(74) *Attorney, Agent, or Firm* — McDermott Will & Emery LLP (57) ABSTRACT

A memory includes conductive layers provided to extend along the word lines, memory cells each including a diode having a cathode connected to the conductive layer and a source line reading data stored in the memory cells, wherein either the conductive layers or the bit lines are in floating states in a standby time.

20 Claims, 4 Drawing Sheets

MEMORY

CROSS-REFERENCE TO RELATED APPLICATIONS

The priority application number JP2008-298645, Memory, Nov. 21, 2008, Kouichi Yamada, JP2008-298632, Memory, Nov. 21, 2008, Kouichi Yamada, upon which this patent application is based is hereby incorporated by reference.

BACKGROUND OF THE INVENTION

1. Field of the Invention

The present invention relates to a memory, and more particularly, it relates to a memory comprising memory cells including diodes.

2. Description of the Background Art

A crosspoint mask ROM (hereinafter referred to as a diode ROM) having a plurality of memory cells, each including a diode, arranged in the form of a matrix is generally known as an exemplary memory.

A memory comprising a plurality of word lines, a plurality of bit lines arranged to intersect with a plurality of word lines, a transistor connected to each of the plurality of word lines and entering an ON-state by selecting the corresponding word line, and a plurality of memory cells each including a diode having a cathode connected to a first source/drain region (conductive layer) of the transistor and an anode connected or not connected to the bit line is disclosed in general. In the conventional memory, cathodes of the plurality of diodes are connected to the first source/drain region (conductive layer) of the transistor. The conductive layer is precharged to reach a high level in a standby time and bit lines are grounded.

SUMMARY OF THE INVENTION

A memory according to a first aspect of the present invention comprises a plurality of word lines, a plurality of bit lines arranged to intersect with the plurality of word lines, conductive layers provided to extend along the word lines, memory cells arranged on positions where the conductive layers and the bit lines intersect with each other and each including a diode having a cathode connected to the conductive layer and a source line reading data stored in the memory cells, wherein either the conductive layers or the bit lines are in floating states in a standby time.

According to the aforementioned structure, the memory according to the first aspect of the present invention can suppress a leak current in the standby time.

A memory according to a second aspect of the present invention comprises a plurality of word lines, a plurality of bit lines arranged to intersect with the plurality of word lines, conductive layers provided to extend along the word lines, memory cells arranged on positions where the conductive layers and the bit lines intersect with each other and each including a diode having a cathode connected to the conductive layer, a source line reading data stored in the memory cells, and transistors having first source/drain regions connected to the bit lines and second source/drain regions connected to a prescribed potential and entering ON-states when conducting a test for evaluating a leak phenomenon in a standby time.

According to the aforementioned structure, the memory according to the second aspect of the present invention can reduce time in conducting the test for evaluating the leak phenomenon in the standby time.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference.

First Embodiment

A structure of a crosspoint diode ROM according to a first embodiment will be now described with reference to FIGS. 1 and 2.

Figure 1:
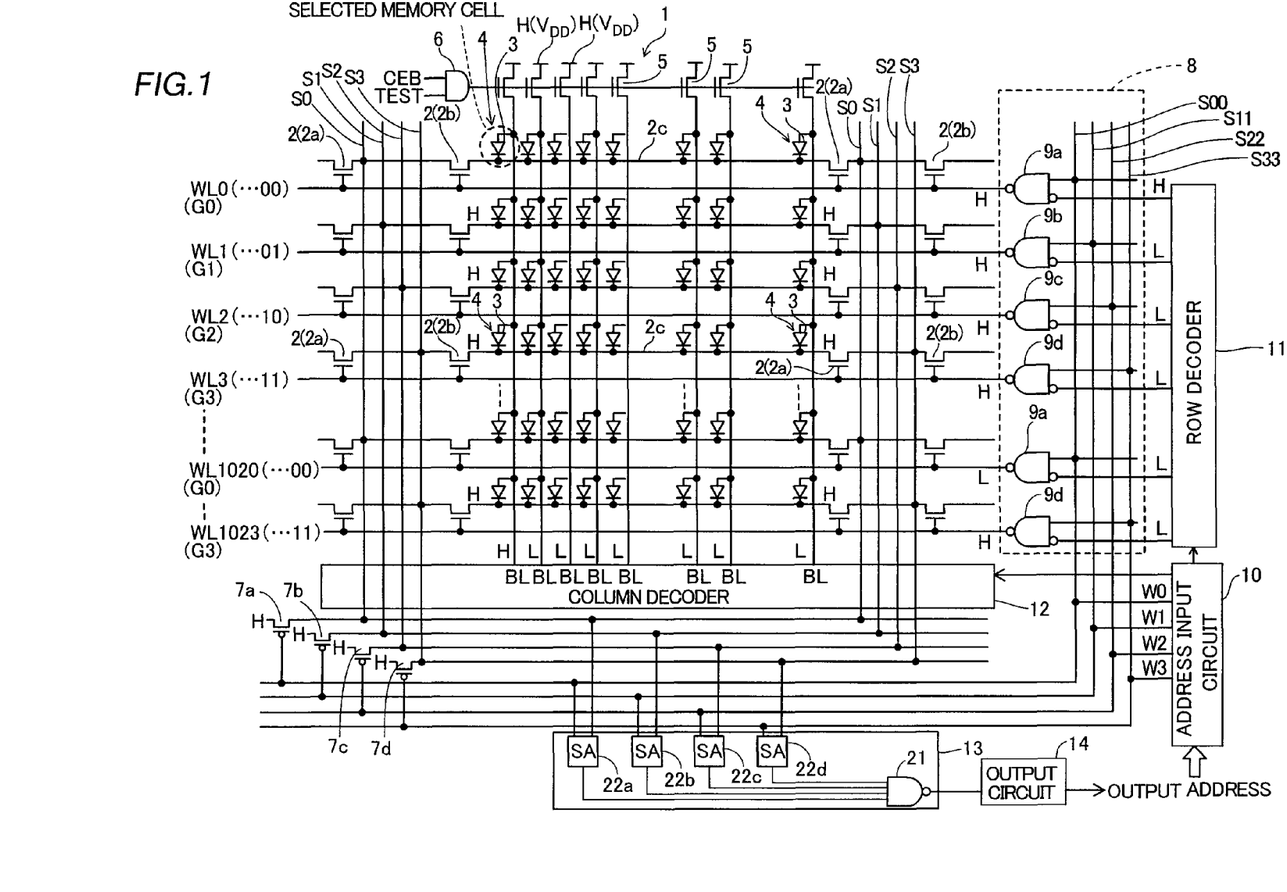
FIG. 1 is a circuit diagram showing a structure of a crosspoint diode ROM according to a first embodiment of the present invention.

In the crosspoint diode ROM according to the first embodiment of the present invention, a plurality of word lines WL and a plurality of bit lines BL are arranged in a memory cell array 1 to intersect with each other, as shown in FIG. 1. The word lines WL and the bit lines BL are connected to a row decoder 11 and a column decoder 12, respectively, as described later. 1024 word lines WL are arranged in the memory cell array 1, and an address having a plurality of digits consisting of bits including "0" and "1" is allocated to each of the 1024 word lines WL. While serial numbers 0 to 1023 are sequentially assigned to the 1024 word lines WL, FIG. 1 illustrates only the word lines WL having the serial numbers 0 to 3, 1020 and 1023 in the 1024 word lines WL.

The 1024 word lines WL are classified into four word line groups G0 to G3 each including 256 word lines WL. More specifically, the first word line group G0 includes word lines WL having addresses with lower digits (bits) (0,0) and identified in FIG. 1 as word lines WL having address digit patterns such as ( . . . 00), while the second word line group G1 includes word lines WL having addresses with lower digits (bits) (0,1) and identified in FIG. 1 as word lines WL having address digit patterns such as ( . . . 01). The third word group G2 includes word lines WL having addresses with lower digits (bits) (1,0) and identified in FIG. 1 as word lines WL having address digit patterns such as ( . . . 10), while the fourth word group G3 includes word lines WL having addresses with lower digits (bits) (1,1) and identified in FIG. 1 as word lines WL having address digit patterns such as ( . . . 11).

The gate electrodes of a prescribed number of selection transistors 2 are connected to each word line WL at prescribed intervals. Each selection transistor 2 is constituted by a pair of n-channel transistors 2a and 2b. The pair of n-channel transistors 2a and 2b constituting each selection transistor 2 have a common source region. In the selection transistors 2 connected to the same word line WL, each pair of a first selection transistor 2 (n-channel transistor 2a) and a second selection transistor 2 (n-channel transistor 2b) adjacent to each other have a common drain region (conductive layer 2c).

A plurality of memory cells 4 each including a diode 3 are provided in the memory cell array 1. In other words, each memory cell 4 consists of the diode 3. The plurality of memory cells 4 are arranged in the form of a matrix along the plurality of word lines WL and the plurality of bit lines BL, while a prescribed number of such memory cells 4 are connected to each word line WL through the corresponding selection transistor 2. More specifically, the cathodes of the prescribed number of diodes 3 are connected to the drain regions (conductive layer 2c) of the n-channel transistors 2a and 2b constituting the corresponding selection transistor 2. The anodes of the diodes 3 of prescribed memory cells 4 (holding data "1") included in the plurality of memory cells 4 are connected to the corresponding bit lines BL, while the anodes of the diodes 3 of the remaining memory cells 4 (holding data "0") are not connected to the corresponding bit lines BL. In the diode ROM, the data held in each memory cell 4 is determined as "0" or "1" depending on whether or not the anode of the diode 3 of this memory cell 4 is connected to the corresponding bit line BL.

First source/drain regions of n-channel transistors 5 are connected to ends of the bit lines BL on a side opposite to the column decoder 12 side described later. High-level potentials (H, $V_{DD}$, or H($V_{DD}$),) are connected to second source/drain regions of the n-channel transistors 5. An output side of an AND circuit 6 is connected to gate electrodes of the n-channel transistors 5. An inverted signal CEB of a chip enable signal CE and a start signal TEST of a test for evaluating a leak phenomenon in a standby time are input in an input side of the AND circuit 6. The leak phenomenon in the standby time means a phenomenon of the leak of a current from the cathode of each diode 3 to the anode by applying an inversely-biased voltage to the diode 3 when the conductive layer 2c is precharged to reach a high level and the bit line BL is grounded in the standby time of the crosspoint diode ROM. Each n-channel transistor 5 is an example of the "transistor entering an ON-state when conducting a test for evaluating a leak phenomenon" in the present invention. The AND circuit 6 is an example of the "logic circuit connected to gate electrodes of transistors" in the present invention.

P-channel transistors 7a to 7d are arranged one by one for four signal lines S0 to S3, respectively. More specifically, the p-channel transistor 7a has a drain connected to the signal line S0 and a gate connected to another signal line S00. The p-channel transistor 7b has a drain connected to the signal line S1 and a gate connected to another signal line S11. The p-channel transistor 7c has a drain connected to the signal line S2 and a gate connected to another signal line S22. The p-channel transistor 7d has a drain connected to the signal line S3 and a gate connected to another signal line S33. Sources of the p-channel transistors 7a to 7d are supplied with high-level signals. The high-level potential is an example of the "potential on a high voltage side" in the present invention. Each of the signal lines S0 to S3 is an example of the "source line" in the present invention.

A word line control circuit 8 for controlling potentials of the word lines WL is provided between the plurality of word lines WL and the row decoder 11. This word line control circuit 8 is constituted by the four signal lines S00 to S33 and a plurality of two-input NAND circuits 9a to 9d provided in correspondence to the four signal lines S00 to S33 respectively. The two-input NAND circuits 9a are arranged one by one for the word lines WL included in the first word line group G0 corresponding to the first signal line S00 respectively. The two-input NAND circuit 9b are arranged one by one for the word lines WL included in the second word line group G1 corresponding to the second signal line S11 respectively. The two-input NAND circuits 9c are arranged one by one for the word lines WL included in the third word line group G2 corresponding to the third signal line S22 respectively. The two-input NAND circuit 9d are arranged one by one for the word lines WL included in the fourth word line group G3 corresponding to the fourth signal line S33 respectively.

First input terminals of the two-input NAND circuits 9a are connected to the signal line S00, while first input terminals of the two-input NAND circuits 9b are connected to the signal line S11. First input terminals of the two-input NAND circuits 9c are connected to the signal line S22, while first input terminals of the two-input NAND circuits 9d are connected to the signal line S33. Respective second input terminals of the two-input NAND circuits 9a to 9d are connected to corresponding output terminals of the row decoder 11 through inverter circuits. Respective output terminals of the two-input NAND circuits 9a to 9d are connected to the corresponding word lines WL.

When a prescribed word line WL is selected, the row decoder 11 supplies a high-level signal (H) to the signal line, included in the signal lines S00 to S33, corresponding to the word line group (G0 in the first embodiment) including the selected word line WL. On the other hand, when the prescribed word line WL is selected, the row decoder 11 supplies low-level signals (L) to the signal lines, included in the signal lines S00 to S33, corresponding to the remaining three word line groups (G1 to G3 in the first embodiment) not including the selected word line WL. The signal lines S00 to S33 are supplied with signals W0 to W3, respectively.

An address input circuit 10, the row decoder 11, the column decoder 12, a data determination circuit 13 and an output circuit 14 are provided outside the memory cell array 1. The address input circuit 10 has a function of supplying address data to the row decoder 11 and the column decoder 12 in response to a prescribed address externally received therein. In other words, a signal line control circuit (not shown) for generating signals corresponding to the externally received address is provided in the address input circuit 10. This signal line control circuit has a function of controlling the potentials of the signals W0 to W3 on the basis of the lower two digits (bits) of the address corresponding to the selected word line WL.

The column decoder 12 has a function of supplying signals having prescribed potentials to the bit lines BL connected thereto, as shown in FIG. 1. More specifically, the column decoder 12 is so formed as to select a prescribed bit line BL on the basis of the address data supplied from the address input circuit 10, for supplying a high-level signal to the selected bit line BL while supplying low-level signals to the nonselected bit lines BL.

Figure 2:
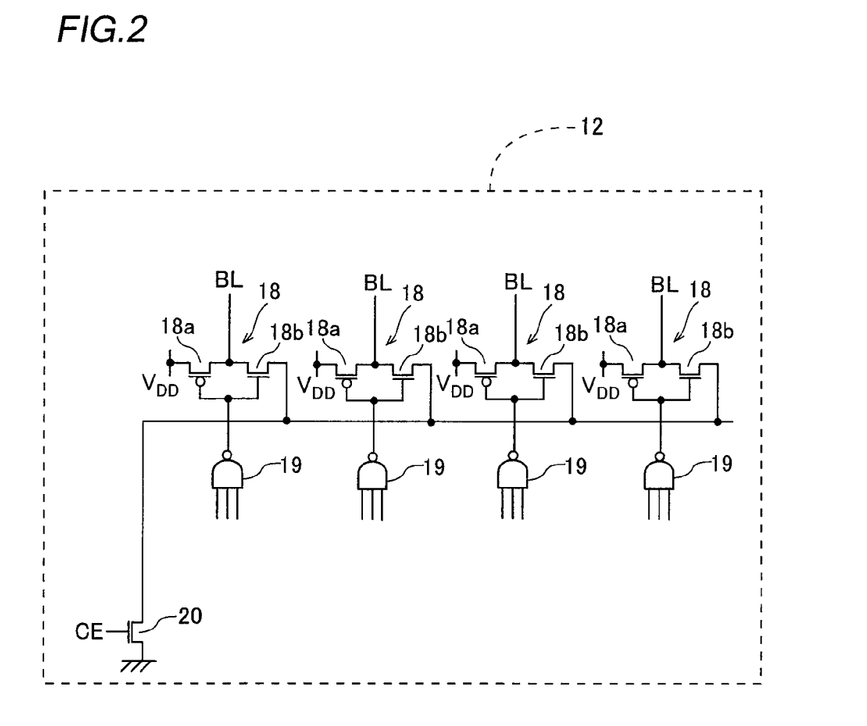
FIG. 2 is a circuit diagram showing an internal structure of a column decoder of the diode ROM according to the first embodiment shown in FIG. 1.

As shown in FIG. 2, the column decoder 12 is constituted by inverter circuits 18 each consisting of a p-channel transistor 18a and an n-channel transistor 18b and NAND circuits 19. Output sides of the inverter circuits 18 are connected to the bit lines BL and input sides are connected to output sides of the NAND circuits 19. While three input terminals are connected to the input side of each NAND circuit 19, the input terminal may be provided in a number other than 3. First source/drain regions of the p-channel transistors 18a of the inverter circuits 18 are connected to high-level signals ($V_{DD}$). First source/drain regions of the n-channel transistors 18b of the inverter circuits 18 are connected to second source/drain regions of the p-channel transistors 18a, and second source/drain regions of the n-channel transistors 18b are connected to a first source/drain region of an re-channel transistor 20. A second source/drain region of the n-channel transistor 20 is connected to a ground potential, and a chip enable signal CE is supplied to a gate of the n-channel transistor 20. The one n-channel transistor 20 is provided for the plurality of bit lines BL. The re-channel transistor 20 is an example of the "first transistor" in the present invention.

As shown in FIG. 1, the data determination circuit 13 has a function of determining potential of data (signal) read from a selected memory cell 4 and supplying a signal responsive to the result of this determination to the output circuit 14. More specifically, the data determination circuit 13 supplies a low-level signal to the output circuit 14 when the data held in the selected memory cell 4 is at a high level, while supplying a high-level signal to the output circuit 14 when the data held in the selected memory cell 4 is at a low level. The output circuit 14 has a function of outputting a signal in response to the signal output from the data determination circuit 13. More specifically, the output circuit 14 outputs a high-level signal when the data determination circuit 13 outputs a low-level signal, while outputting a low-level signal when the data determination circuit 13 outputs a high-level signal.

The data determination circuit 13 includes a four-input NAND circuit 21 and sense amplifiers 22a to 22d. The four-input NAND circuit 21 has an input terminal connected to output terminals of the sense amplifiers 22a to 22d and an output terminal connected to the output circuit 14. The sense amplifiers 22a to 22d have first input terminals connected with the signal lines S00 to S33, respectively, and second input terminals connected with the signal lines S0 to S3, respectively. The sense amplifiers 22a to 22d output high-level signals to the input terminal of the four-input NAND circuit 21 when the first input terminals thereof are supplied with low-level signals, while outputting high- or low-level signals to the input terminal of the four-input NAND circuit 21 in response to signals from the second input terminals when the first input terminals thereof are supplied with high-level signals.

An operation in a standby time of the crosspoint diode ROM according to the first embodiment will be now described with reference to FIGS. 1 and 2.

In the standby time before a read operation, the p-channel transistors 7a to 7d enter ON-states, thereby adjusting the signal lines S0 to S3 to high levels ($V_{DD}$), while the selection transistors 2 enters ON-states by setting the word lines WL to high levels. Thus, the conductive layers 2c are precharged to high levels ($V_{DD}$-$V_t$: $V_t$ is a threshold voltage of the selection transistor 2). In the standby time, high-level signals from the NAND circuits 19 are input in the inverter circuits 18 connected to the bit lines BL and the chip enable signal CE is at a low level, and hence the n-channel transistor 20 connected to the inverter circuits 18 shown in FIG. 2 enters an OFF-state. Thus, the bit lines BL are in floating states in the standby time. When no n-channel transistor 20 is provided as in a conventional case, the bit lines BL are adjusted to low level (GND) by inputting high-level signals to the inverter circuits 18.

A test for evaluating a leak phenomenon in the standby time of the crosspoint diode ROM according to the first embodiment will be now described with reference to FIGS. 1 and 2. The test for evaluating the leak phenomenon in the standby time is to produce a state where the potentials of the bit lines BL are high by leaking currents from the cathodes of the diodes 3 to the anodes and evaluate time required for first access to the memory cells 4 from the standby time. This test is conducted before shipment of the crosspoint diode ROM.

Similarly to the aforementioned standby time, the p-channel transistors 7a to 7d enter ON-states, thereby adjusting the signal lines S0 to S3 to high levels ($V_{DD}$), while the selection transistors 2 enters ON-states by adjusting the word lines WL to high levels. Thus, the conductive layers 2c are precharged to high levels ($V_{DD}$-$V_t$: $V_t$ is a threshold voltage of the selection transistor 2). At this time, the inverted signal CEB of the chip enable signal CE is at a high level, and the start signal TEST for starting the test for evaluating the leak phenomenon in the standby time is stepped up to a high level. The inverted signal CEB of the chip enable signal CE and the start signal TEST are input in the AND circuit 6 shown in FIG. 1, thereby outputting the high-level signal from the AND circuit 6. Thus, the n-channel transistors 5 having the first source/drain regions connected to the bit lines BL enter ON-states. Consequently, the high-level potentials ($V_{DD}$) connected to the second source/drain regions of the n-channel transistors 5 supply potentials of $V_{DD}$-$V_t$ to the bit lines BL. Thus, a phenomenon that the potentials of the bit lines BL rise by leaking currents from the conductive layers 2c to the bit lines BL is produced at a short time. After the n-channel transistors 5 enter OFF-states, a prescribed memory cell 4 is accessed for data read operation, and the time required for the access is evaluated.

The operation of precharging the conductive layers 2c to the high levels and the operation of producing the phenomenon that the potentials of the bit lines BL rise by supplying the potentials of $V_{DD}$-$V_t$ to the bit lines BL and leaking currents from the conductive layers 2c to the bit lines BL in a short time are performed again, and a memory cell 4 different from the aforementioned prescribed memory cell 4. The aforementioned operations are repeated, thereby evaluating the time required for accessing to all of the memory cells 4 from a standby state.

In the crosspoint diode ROM according to the first embodiment of the present invention, the following effects can be obtained:

(1) The bit lines BL are brought into the floating states in the standby time, whereby leak currents can be inhibited from flowing from the high-level potentials ($V_{DD}$) to the ground potential through the p-channel transistor 7a (7b to 7d), the source line S0 (S1 to S3), the selection transistors 2, the conductive layers 2c and the diodes 3, dissimilarly to a case where the bit lines BL are grounded in the standby time.

(2) The n-channel transistor 20 enters an OFF-state on the basis of the chip enable signal CE in the standby time, whereby the chip enable signal CE is at a low level in the standby time, and hence the n-channel transistor 20 can reliably enter the OFF-state.

(3) The memory cells 4 are constituted by the diodes 3, whereby the diode ROM can be easily formed.

(4) The first source/drain region of the n-channel transistor 20 is connected to the terminals, supplying low potentials, of the inverter circuits 18 having the output sides connected to the bit lines BL, and the second source/drain region of the n-channel transistor 20 is connected to the ground potential, so that the n-channel transistor 20 enters the OFF-state, whereby the bit lines BL can be easily brought into the floating states.

(5) The one n-channel transistor 20 is provided for the plurality of bit lines BL, whereby the structure of the memory cell array 1 can be simplified dissimilarly to a case where the n-channel transistors 20 are provided one by one for the plurality of bit lines BL.

(6) The selection transistors 2 having the first source/drain regions connected with the conductive layers 2c and the second source/drain regions connected with the signal lines S0 to S3 is provided, whereby the conductive layers 2c and the signal lines S0 to S3 can be easily electrically connected to each other through the selection transistors 2.

(7) The n-channel transistors 5 having the first source/drain regions connected to the bit lines BL and the second source/drain regions connected to the high-level potentials ($V_{DD}$), and entering the ON-state when conducting the test for evaluating the leak phenomenon in the standby time is provided, whereby the potentials of the bit lines BL can be adjusted to the high-level potentials in a short time when conducting the test for evaluating the leak phenomenon in the standby time. Thus, the time in conducting the test for evaluating the leak phenomenon in the standby time can be reduced dissimilarly to a case where the potentials of the bit lines BL are increased due to leak currents flowing from the cathodes of the diodes 3 to the anodes resulting from the continuous standby states.

(8) In the test for evaluating the leak phenomenon in the standby time, the n-channel transistors 5 enters the ON-states after precharging the conductive layers 2c, whereby the leak phenomenon in the standby time that currents flow from the cathodes of the diodes 3 to the anodes after precharging the conductive layers 2c can be easily produced in the short time.

(9) The leak phenomenon in the standby time that leak currents flow from the cathodes of the diodes 3 to the anodes is produced in the short time by bringing the n-channel transistors 5 into the ON-states to supply the high-level potentials ($V_{DD}$-$V_t$) to the bit lines BL, whereby the leak phenomenon in the standby time can be produces in the short time without the continuous standby states dissimilarly to the case where the potentials of the bit lines BL are increased due to leak currents flowing from the cathodes of the diodes 3 to the anodes resulting from the continuous standby states.

(10) The n-channel transistors 5 enter the ON-states on the basis of the start signal TEST of the test for evaluating the leak phenomenon in the standby time, whereby the leak phenomenon can be produced in the short time only in the test for evaluating the leak phenomenon in the standby time.

(11) The start signal TEST of the test for evaluating the leak phenomenon in the standby time and the inverted signal CEB of the chip enable signal CE are connected to the input side of the AND circuit 6, whereby the n-channel transistors 5 can reliably enter the ON-states when the inverted signal CEB of the chip enable signal CE is at the high level (in the standby time).

(12) The n-channel transistors 5 are provided one by one for the plurality of bit lines BL, whereby the phenomenon that the potentials of the bit lines BL are increased by leaking currents from the conductive layers 2c to the bit lines BL can be produced in a shorter time as compared with a case where one n-channel transistor 5 is provided for the plurality of bit lines BL.

(13) The n-channel transistors 5 are connected to the ends of the bit lines BL on the side opposite to the side connected to the column decoder 12, whereby no apparatus such as the column decoder 12 is provided on the end sides of the bit lines BL on the side opposite to the side connected to the column decoder 12, and hence the n-channel transistors 5 can be easily arranged.

Second Embodiment

Figure 3:
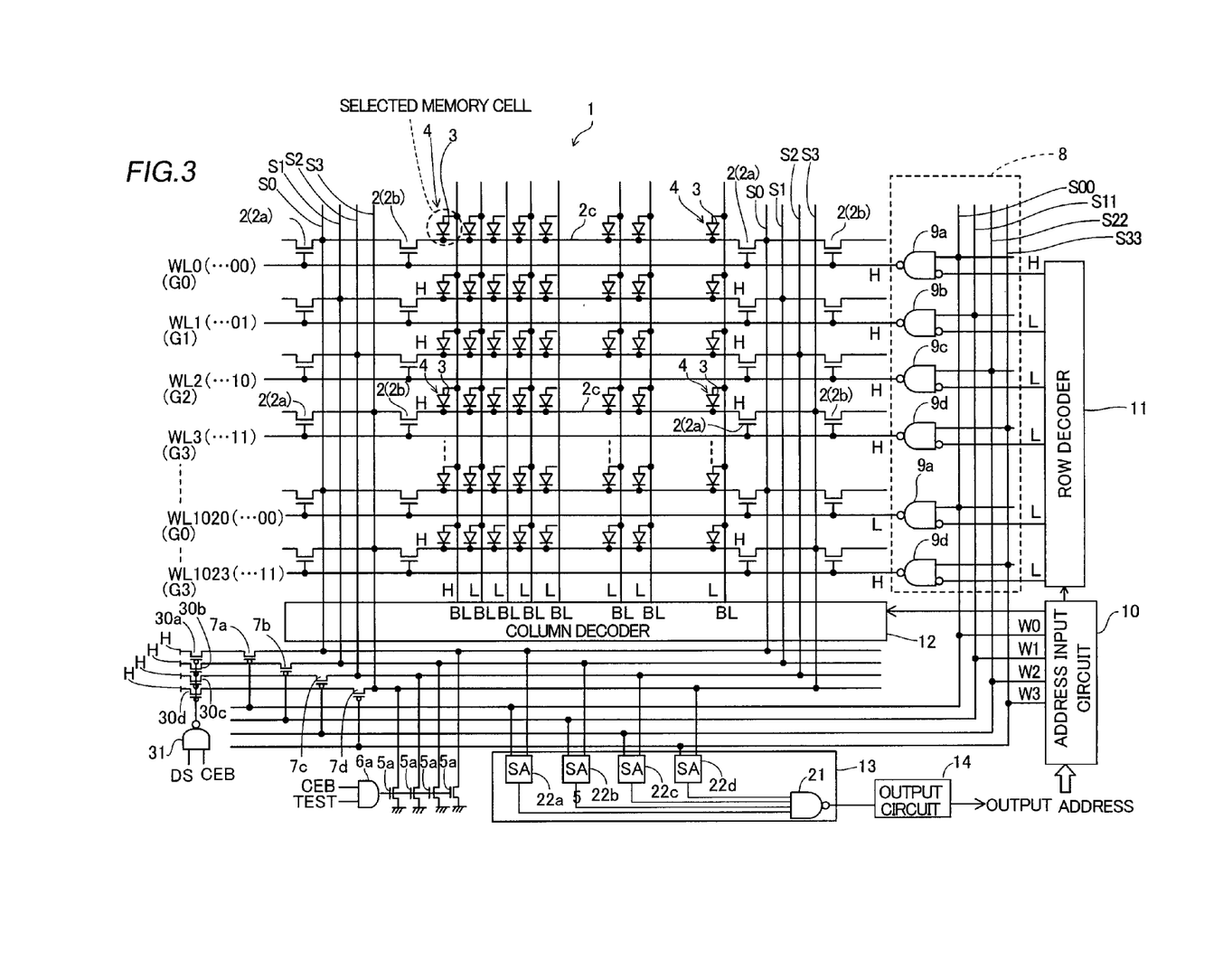
FIG. 3 is a circuit diagram showing a structure of a crosspoint diode ROM according to a second embodiment of the present invention.

In a crosspoint diode ROM according to a second embodiment of the present invention, p-channel transistors 30a to 30d having first source/drain regions connected to high-level potentials ($V_{DD}$) and second source/drain regions connected to first source/drain regions of p-channel transistors 7a to 7d is provided as shown in FIG. 3. An output side of a NAND circuit 31 is connected to gates of the p-channel transistors 30a to 30d. The p-channel transistors 30a to 30d are provided one by one for four signal lines S0 to S3 respectively. An inverted signal CEB of a chip enable signal CE reaching a low level in a standby time and a deep standby signal DS reaching a high level in a precharge time are input in an input side of the NAND circuit 31. The NAND circuit 31 is so formed that a high-level signal is output in the standby time. Each of the p-channel transistors 30a to 30d is an example of the "second transistor" in the present invention. The NAND circuit 31 is an example of the "logic circuit connected to a gate electrode of a second transistor" in the present invention.

First source/drain regions of n-channel transistors 5a are connected to signal lines S0, S1, S2 and S3, respectively. Second source/drain regions of the n-channel transistors 5a are grounded. An output side of an AND circuit 6a is connected to gate electrodes of the re-channel transistors 5a. An inverted signal CEB of a chip enable signal CE and a start signal TEST of a test for evaluating a leak phenomenon in a standby time are input in an input side of the AND circuit 6a. In the test for evaluating the leak phenomenon in the standby time, the re-channel transistors 5a enter ON-states, so that conductive layers 2c are discharged.

Figure 4:
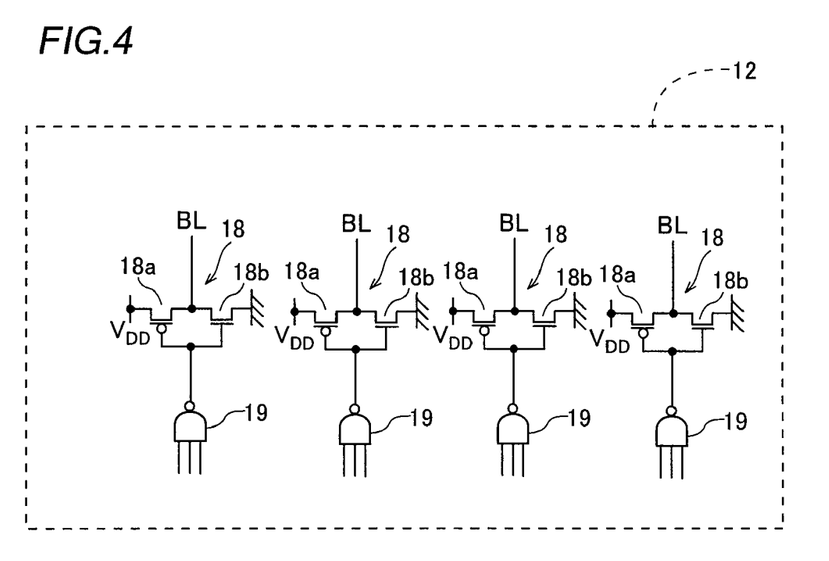
FIG. 4 is a circuit diagram showing an internal structure of a column decoder of the diode ROM according to the second embodiment shown in FIG. 3.

In a column decoder 12 of the second embodiment, second source/drain regions of n-channel transistors 18b are grounded as shown in FIG. 4, dissimilarly to the aforementioned first embodiment.

The remaining structure of the second embodiment is similar to that of the aforementioned first embodiment.

An operation in the standby time of the crosspoint diode ROM according to the second embodiment will be now described with reference to FIGS. 3 and 4.

The deep standby signal DS is at a low level and the inverted signal CEB of the chip enable signal CE is at a high level in the standby time, and hence a high-level signal is output to the output side of the NAND circuit 31. Thus, the p-channel transistors 30a to 30d simultaneously enter OFF-states in the standby time. Consequently, the conductive layers 2c (cathodes of diodes 3) are brought into floating states. In the standby time, the deep standby signal DS is stepped up to a high level only when the conductive layers 2c are precharged. Thus, the inverted signal CEB of the chip enable signal CE is at the high level, and hence a low level signal is output from the NAND circuit 31. Consequently, the p-channel transistors 30a to 30d enter ON-states, and the conductive layers 2c are precharged. In the standby time, high-level signals are input in inverter circuits 18 shown in FIG. 4, so that bit lines BL connected to output sides of the inverter circuits 18 are grounded.

The remaining operation of the second embodiment will be similar to that of the aforementioned first embodiment.

In the crosspoint diode ROM according to the second embodiment of the present invention, the following effects can be obtained:

(14) The p-channel transistors 30a to 30d are brought into the OFF-states in the standby time, whereby leak currents can be inhibited from flowing from the high-level potentials ($V_{DD}$) to the ground potential through the p-channel transistor 7a (7b to 7d), a source line S0 (S1 to S3), selection transistors 2, the conductive layers 2c and the diodes 3 in the standby time.

(15) The p-channel transistors 30a to 30d enter the OFF-states on the basis of the deep standby signal DS reaching the high level in the precharge time and the inverted signal CEB of the chip enable signal CE, whereby the p-channel transistors 30a to 30d can enter the ON-states within the standby time and hence the conductive layers 2c can be precharged, dissimilarly to a case where the p-channel transistors 30a to 30d enter OFF-states in all periods within the standby time, and hence the conductive layers 2c can be precharged.

(16) The deep standby signal DS reaching the high level in the precharge time and the inverted signal CEB of the chip enable signal CE reaching the low level in the standby time are connected to the input side of the NAND circuit 31, and the high-level signal is output from the NAND circuit 31 in the standby time, whereby the p-channel transistors 30a to 30d can easily enter the OFF-states in the standby time.

(17) The p-channel transistors 30a to 30d simultaneously enter the OFF-states in the standby time on the basis of the deep standby signal DS reaching the high level in the precharge time, whereby the signal lines S0 to S3 can be simultaneously brought into the floating states.

Although the present invention has been described and illustrated in detail, it is clearly understood that the same is by way of illustration and example only and is not to be taken by way of limitation, the spirit and scope of the present invention being limited only by the terms of the appended claims.

For example, while the inverted signal CEB of the chip enable signal CE is input in the AND circuit 6 in each of the aforementioned first and second embodiments, the present invention is not restricted to this but the chip enable signal CE may be input in the AND circuit 6. At this time, an inverter circuit is provided on the input side of the AND circuit 6 in which the chip enable signal CE is input, and a signal obtained by inverting the chip enable signal CE is input in the AND circuit 6.

While the chip enable signal CE is input in the re-channel transistor 20 included in the column decoder 12 in the aforementioned first embodiment, the present invention is not restricted to this but a p-channel transistor may be employed in place of the n-channel transistor 20 and the inverted signal CEB of the chip enable signal may be input.

While the high-level potentials ($V_{DD}$) are connected to the second source/drain regions of the n-channel transistors 5 entering the ON-states when conducting the test for evaluating the leak phenomenon in the standby time in the aforementioned first embodiment, the present invention is not restricted to this but potentials other than the high-level potentials ($V_{DD}$) may be connected to the second source/drain regions of the n-channel transistors 5 so far as the leak phenomenon in the standby time can be intentionally produced.

While the inverted signal CEB of the chip enable signal CE is input in the NAND circuit 31 in the aforementioned second embodiment, the present invention is not restricted to this but the chip enable signal CE may be input in the NAND circuit 31. At this time, an inverter circuit is provided on the input side of the NAND circuit 31 in which the chip enable signal CE is input, and a signal obtained by inverting the chip enable signal CE is input in the NAND circuit 31.

While the output side of the NAND circuit 31 is connected to the gates of the p-channel transistors 30a to 30d in the aforementioned second embodiment, the present invention is not restricted to this but an output side of an inverter circuit may be connected to the gates of the p-channel transistors 30a to 30d and the chip enable signal CE may be input in an input side of the inverter circuit.

What is claimed is:

1. A memory comprising:
a plurality of word lines;
a plurality of bit lines arranged to intersect with said plurality of word lines;
conductive layers provided to extend along said word lines;
memory cells arranged on positions where said conductive layers and said bit lines intersect with each other and each including a diode having a cathode connected to said conductive layer; and
a source line reading data stored in said memory cells, wherein
either said conductive layers or said bit lines are in floating states in a standby time.

2. The memory according to claim 1, further comprising:
a column decoder connected to said plurality of bit lines; and
a first transistor provided between ends of said bit lines on a side connected to said column decoder and a ground potential, wherein
said first transistor enters an OFF-state in the standby time, thereby bringing said bit lines into said floating states.

3. The memory according to claim 2, wherein
said first transistor enters the OFF-state on a basis of a chip enable signal in the standby time.

4. The memory according to claim 2, further comprising inverter circuits provided between said first transistor and said bit lines and having output terminals connected to said bit lines, wherein
a first source/drain region of said first transistor is connected to terminals, supplying low potentials, of said inverter circuits, and a second source/drain region of said first transistor is connected to said ground potential.

5. The memory according to claim 2, wherein said first transistor is provided for said plurality of bit lines.

6. The memory according to claim 1, further comprising a second transistor provided between said conductive layers and a potential on a high voltage side supplied to said source line, wherein
said second transistor enters an OFF-state in the standby time, thereby bringing said conductive layers into said floating states.

7. The memory according to claim 6, wherein
said second transistor enters the OFF-state in the standby time on a basis of a signal reaching a high level in a precharge time.

8. The memory according to claim 7, further comprising a logic circuit connected to a gate electrode of said second transistor, wherein
said signal reaching the high level in the precharge time and an inverted signal of a chip enable signal reaching a low level in the standby time are connected to an input side of said logic circuit, and said logic circuit outputs a signal having a high level in the standby time.

9. The memory according to claim 6, wherein
said source line includes a plurality of source lines connected to respective groups each consisting of a prescribed number of word lines, and
said second transistors are provided one by one for said plurality of source lines, respectively.

10. The memory according to claim 9, wherein
said second transistors provided one by one for said plurality of source lines respectively simultaneously enter the OFF-states in the standby time on a basis of said signal reaching the high level in the precharge time.

11. The memory according to claim 1, wherein
said memory cells are each constituted by said diode.

12. The memory according to claim 1, further comprising selection transistors provided between said conductive layers and said source line, wherein said conductive layers are connected to first source/drain regions of said selection transistors and said source line is connected to second source/drain regions of said selection transistors.

13. A memory comprising:

a plurality of word lines, a plurality of bit lines arranged to intersect with said plurality of word lines, conductive layers provided to extend along said word lines, memory cells arranged on positions where said conductive layers and said bit lines intersect with each other and each including a diode having a cathode connected to said conductive layer, a source line reading data stored in said memory cells, and transistors having first source/drain regions connected to said bit lines and second source/drain regions connected to a prescribed potential and entering ON-states when conducting a test for evaluating a leak phenomenon in a standby time.

14. The memory according to claim 13, wherein said transistors enter the ON-states in the standby time in said test for evaluating the leak phenomenon in the standby time.

15. The memory according to claim 13, wherein said leak phenomenon in said standby time that leak currents flow from cathodes of said diodes to anodes is intentionally produced by bring said transistors into the ON-states to supply said prescribed potential to said bit lines.

16. The memory according to claim 13, wherein said transistors enter the ON-states on a basis of a start signal of said test for evaluating the leak phenomenon in the standby time.

17. The memory according to claim 16, further comprising a logic circuit connected to gate electrodes of said transistors, wherein said start signal of said test for evaluating the leak phenomenon in the standby time and either a chip enable signal or an inverted signal of the chip enable signal are connected to an input side of said logic circuit.

18. The memory according to claim 13, wherein said prescribed potential is a potential on a high voltage side.

19. The memory according to claim 13, wherein said transistors are provided one by one for said plurality of bit lines, respectively.

20. The memory according to claim 13, further comprising a column decoder connected to said plurality of bit lines, wherein said transistors are connected to ends of said bit lines on a side opposite to a side connected to said column decoder.

* * * * *